United States Patent [19]

Newman

[11] 4,152,558
[45] May 1, 1979

[54] HOLE SENSING DEVICE FOR SPIKE DRIVER

[75] Inventor: George R. Newman, Lexington, S.C.
[73] Assignee: Canron, Inc., New York, N.Y.
[21] Appl. No.: 779,636
[22] Filed: Mar. 21, 1977
[51] Int. Cl.² ............................................. H01H 3/16
[52] U.S. Cl. ................................. 200/61.42; 104/17 R; 227/2
[58] Field of Search ................. 104/17 R; 73/104; 227/2-6; 33/1 R; 116/114 R; 200/61.41, 61.42; 340/259

[56] References Cited

U.S. PATENT DOCUMENTS

| 2,144,858 | 1/1939 | Smith | 200/61.42 |
| 3,339,040 | 8/1967 | Vilkas | 200/61.41 |
| 3,577,955 | 5/1971 | Palmer | 116/114 R |
| 3,753,404 | 8/1973 | Bryan | 104/17 R |
| 3,753,405 | 8/1973 | Bryan | 104/17 R |
| 4,019,003 | 4/1977 | Duerksen | 200/61.42 |

FOREIGN PATENT DOCUMENTS

| 1315122 | 12/1962 | France | 340/259 |
| 149708 | 9/1961 | U.S.S.R. | 200/61.42 |

Primary Examiner—Robert G. Sheridan
Assistant Examiner—Ross Weaver
Attorney, Agent, or Firm—Wenderoth, Lind & Ponack

[57] ABSTRACT

A hole sensing device for a spike driving machine is disclosed. The sensing device has two projecting fingers both of which ride along the surface of a tie plate as the sensing device is swept along parallel to the rails. The fingers actuate two switches one open and the other closed when the fingers are not contacting the tie plate. When the fingers are both engaging the tie plate the switch associated with the leading finger is open and the other closed. As soon as the leading finger registers with a hole it closes its associated switch completing the circuit and allowing a hole sensing signal to be sent.

7 Claims, 1 Drawing Figure

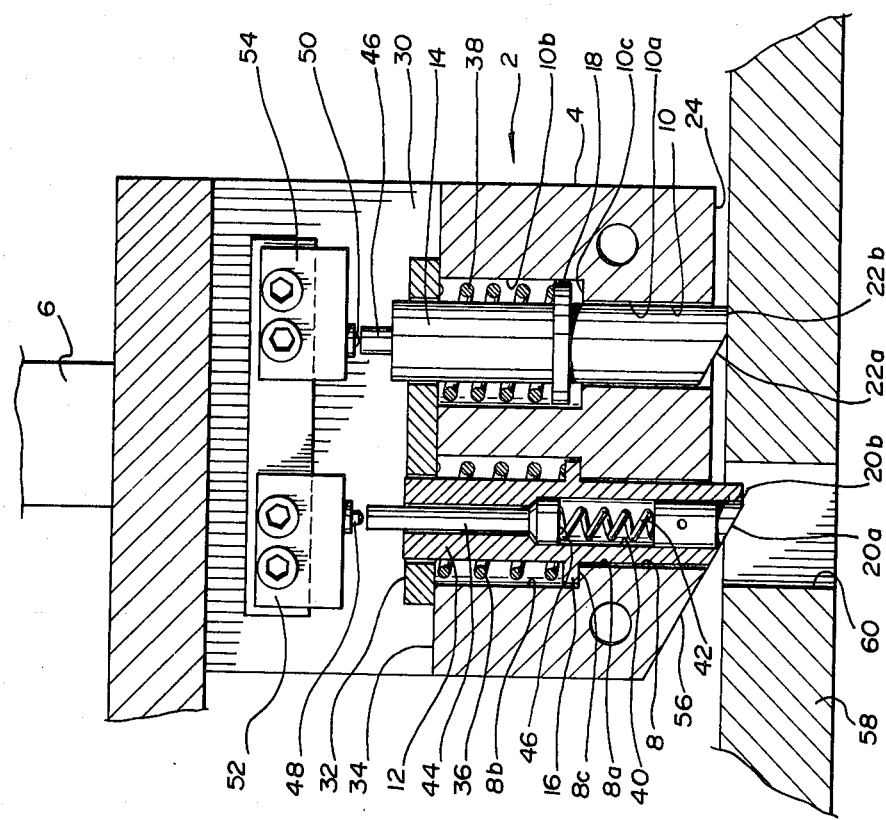

HOLE SENSING DEVICE FOR SPIKE DRIVER

BACKGROUND OF THE INVENTION

This invention relates to a hole sensing device which is particularly useful in a spike driving machine for driving spikes through holes in tie plates to secure rails to ties.

Such a hole sensing device has been proposed in which a finger is slid along the upper surface of a tie plate, the finger operating an electric switch when the finger engages a hole in the tie plate thus providing an electric signal indicative of a sensed hole. This signal may then be sent to a reference mechanism which allows the sweep to continue until a spike setter and spike drive head following the hole sensing device become aligned with the hole at which point the sweep is discontinued.

A problem with the known device is that it is set to operate on a rail tie which is a particular height so that the switch is open while the finger engages the rail tie. However, sometimes a rail tie may be lower than the particular height for which the hole sensing device is set probably because of a tie which is inadvertently lower than the others. When the hole sensing device arrives at the low tie plate the finger drops further than normal and senses a hole anywhere on the tie plate. This ultimately causes a spike to be driven into the tie plate at a location where there is no hole causing damage to the tie plate, spike and the spike driver and setter.

SUMMARY OF THE INVENTION

It is an object of the present invention to obviate or mitigate this disadvantage by providing a hole sensing device which is capable of discriminating between a hole in a tie plate and a low tie plate.

According to the invention, therefore, there is provided a hole sensing device for sensing a hole in a surface, comprising a sensing head movable across the surface, two fingers projecting from the sensing head and being supported in the sensing head for movement inwardly of the sensing head on engagement with the surface, switch means actuated by the two fingers and defining a switch condition indicative of a sensed hole only when one of the fingers is received in a hole in the surface and the other finger is in engagement with the surface.

BRIEF DESCRIPTION OF THE DRAWINGS

The present invention will now be described with reference to the accompanying drawing the single FIGURE of which is a fragmentary view in vertical section of a hole sensing device according to the invention shown in contact with a tie plate.

DESCRIPTION OF PREFERRED EMBODIMENT

The hole sensing device 2 comprises a head 4 connected to a member 6 which is arranged to be vertically movable by means (not shown) such as a pneumatic cylinder mounted on the Y-sweep frame (not shown) of a spike driving machine.

The head 4 has two vertical bores 8 and 10 aligned in a vertical plane, each bore having a relatively narrow portion 8a or 10a and a relatively wide portion 8b or 10b. The bores receive identical cylindrical fingers 12 and 14 each having a circumferential collar 16 and 18, respectively adapted to bear against a shoulder 8c and 10c, respectively, formed where the narrow and wide portions of each bore meet.

The lower end face of each finger is adapted to project below the lower face 24 of the head 4. Each face has a sloping portion 20a and 22a and a flat portion 20b and 22b, the portions 20a and 22a sloping at an angle of approximately 30° with respect to the horizontal.

The upper end of each finger is adapted to project into a cavity 30 in the head 4, through a spring retaining plate 32 mounted on a wall portion 34 partly defining the cavity. A compression spring 36 and 38 is received around each finger 12 and 14 between the retaining plate 32 and the respective collar 16 and 18 to urge the finger downwardly.

Each finger has a stepped blind bore 40 only one of which is shown. A spring 42 is provided in the lower wide portion of each bore 40 and urges against the underside of an actuator pin 44, and 46 the upper position of which is limited by engagement of a shoulder 46 of the pin with the step in the blind bore. Each pin 44 and 46 projects upwardly from the respective finger and is aligned with a respective actuator button 48 and 50 of two switches 52 and 54 mounted in the cavity 30.

The contacts (not shown) of switch 52 are normally closed and the contacts (not shown) of switch 54 are normally open, the two sets of contacts being connected in series with a source of electric power to pass an electric signal through both sets of contacts when a hole is sensed. A suitable hole may be provided in the head 4 for exit of electrical leads.

The bottom face 24 of the head 4 is flat, i.e.- horizontal, over its major portion but is provided with a forward (at left hand side in drawing) chamfered surface 56 sloping at the same angle as surfaces 20a and 22a of the fingers.

Operation of the sensing device 2 will now be described in relation to a tie plate 58 having a hole 60.

When the sensing device is in its raised position, i.e. clear of the rail tie 58, the actuator pins 44 and 46 are spaced from the buttons 48 and 50 and so switch 52 is in its closed condition but switch 54 is in its open condition and so the current is broken.

When the sensing device is lowered initially so that both fingers 12 and 14 engage the upper surface of the tie plate 58 the fingers are pushed upwardly (see finger 14 in drawing) so that both pins 44 and 46 are pushed upwardly against the action of springs 36 and 38 to depress the buttons 48 and 50 thus opening switch 52 and closing switch 54; so the series current is still broken.

The Y-sweep then commences, the hole feeler 2 sweeping to the left as seen in the drawing, with the fingers 12 and 14 sliding along the upper surface of the tie 58. Eventually finger 12 registers with the hole 60 and drops under the action of spring 36 causing pin 44 to release button 48 and close switch 52. Now both switches 52 and 54 are closed and so the series current is complete and a signal indicative of the sensed hole is generated. This signal may, for example, be used to set up a reference mechanism for the spike drive head and spike setter following the hole sensing device 2 on its Y sweep.

It is noted that the sloping surfaces 20a and 22a are provided so that the fingers 12 and 14 can ride easily over minor protrusions on the tie surface and also ride over the left hand lip of hole 60 without snagging as the head continues sweeping to the left even after the hole has been sensed.

The springs 42 are to provide resilient contact with buttons 48 and 50 to prevent damage to the switches even if the fingers 12 and 14 are movable over a wide range.

What is claimed is:

1. A hole sensing device for sensing a hole in a surface, comprising a sensing head movable across the surface, first and second fingers projecting from the sensing head and being supported in the sensing head for movement inwardly of the sensing head on engagement with the surface, and circuit means having a normally open switch and a normally closed switch electrically connected to each other for placing said circuit means in a first conductive condition when said fingers are free of the surface, said switches being engaged by corresponding ones of said fingers for changing the conditions of both said switches when said fingers both engage said surface, thereby keeping the circuit means in the first conductive condition, and for changing the condition of only the switch actuated by the first finger for changing the conductive condition of said circuit means only when said first finger is in engagement with said surface and the second finger is received in a hole in said surface, whereby only when the second finger is in a hole and the first finger is simultaneously in engagement with the surface are both switches in the same condition for changing the conductive condition of the circuit means, thus indicating the detection of a hole.

2. A hole sensing device according to claim 1, in which the fingers are spring biased to project out of the head.

3. A hole sensing device according to claim 2, in which each finger has a bore extending axially of the finger and opening onto an upper end surface of the finger, each finger having an actuator pin received in the bore and spring means mounted in the bore and engaging the respective actuated pin to urge the respective actuator pin upwardly, whereby an upper end portion of the actuator pin protrudes beyond the upper end surface of the finger, each bore having stop means limiting upward travel of the respective actuator pin, each switch having a switch actuator button thereon, each actuator pin being aligned with and cooperating with the respective switch actuator button on the corresponding switch.

4. A hole sensing device as claimed in claim 1, in which the sensing head is movable towards and away from the surface.

5. A hole sensing device as claimed in claim 1, in which the fingers are aligned in the direction of movement of the sensing device across the surface.

6. A hole sensing device according to claim 1, in which the fingers are provided with sloping end portions facing the direction of movement across the surface.

7. A hole sensing device according to claim 1 in which the normally open switch and the normally closed switch are connected electrically in series and the one switch is the normally closed switch and the other switch is the normally open switch, whereby the condition indicating the detection of a hole is a "closed" condition.

* * * * *